(12) United States Patent
Basol

(10) Patent No.: US 7,731,833 B2
(45) Date of Patent: *Jun. 8, 2010

(54) PLATING METHOD AND APPARATUS FOR CONTROLLING DEPOSITION ON PREDETERMINED PORTIONS OF A WORKPIECE

(75) Inventor: Bulent M. Basol, Manhattan Beach, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/932,708

(22) Filed: Oct. 31, 2007

(65) Prior Publication Data

US 2008/0102251 A1   May 1, 2008

Related U.S. Application Data

(60) Division of application No. 11/190,763, filed on Jul. 26, 2005, which is a continuation of application No. 09/961,193, filed on Sep. 20, 2001, now Pat. No. 6,921,551, which is a continuation-in-part of application No. 09/919,788, filed on Jul. 31, 2001, now Pat. No. 6,858,121, which is a continuation-in-part of application No. 09/740,701, filed on Dec. 18, 2000, now Pat. No. 6,534,116.

(60) Provisional application No. 60/224,739, filed on Aug. 10, 2000.

(51) Int. Cl.
  *C25D 5/34* (2006.01)

(52) U.S. Cl. .................. 205/222; 205/93; 205/206
(58) Field of Classification Search .................. 205/93, 205/95, 157, 170, 206, 222, 223
See application file for complete search history.

(56) References Cited

U.S. PATENT DOCUMENTS

| | | | |
|---|---|---|---|
| 5,096,550 A | | 3/1992 | Mayer et al. |
| 5,256,565 A | | 10/1993 | Bernhardt et al. |
| 5,486,234 A | | 1/1996 | Contolini et al. |
| 5,863,412 A | | 1/1999 | Ichinose et al. |
| 6,004,880 A | | 12/1999 | Liu et al. |
| 6,090,239 A | | 7/2000 | Liu et al. |
| 6,107,186 A | * | 8/2000 | Erb .................. 438/633 |
| 6,121,141 A | * | 9/2000 | Woo et al. ........... 438/687 |
| 6,224,737 B1 | | 5/2001 | Tsai et al. |

(Continued)

*Primary Examiner*—Nam X Nguyen
*Assistant Examiner*—Luan V Van
(74) *Attorney, Agent, or Firm*—Knobbe Martens Olson & Bear LLP

(57) ABSTRACT

The present invention relates to methods and apparatus for plating a conductive material on a workpiece surface in a highly desirable manner. Using a workpiece-surface-influencing device, such as a mask or sweeper, that preferentially contacts the top surface of the workpiece, relative movement between the workpiece and the workpiece-surface-influencing device is established so that an additive in the electrolyte solution disposed on the workpiece and which is adsorbed onto the top surface is removed or otherwise its amount or concentration changed with respect to the additive on the cavity surface of the workpiece. Plating of the conductive material can place prior to, during and after usage of the workpiece-surface-influencing device, particularly after the workpiece surface influencing device no longer contacts any portion of the top surface of the workpiece, to achieve desirable semiconductor structures.

48 Claims, 7 Drawing Sheets

U.S. PATENT DOCUMENTS

| | | |
|---|---|---|
| 6,270,647 B1 | 8/2001 | Graham et al. |
| 6,284,121 B1 | 9/2001 | Reid |
| 6,315,883 B1 | 11/2001 | Mayer et al. |
| 6,346,479 B1 | 2/2002 | Woo et al. |
| 6,355,153 B1 | 3/2002 | Uzoh et al. |
| 6,375,823 B1 * | 4/2002 | Matsuda et al. ............ 205/117 |
| 6,402,925 B2 | 6/2002 | Talieh |
| 6,482,656 B1 | 11/2002 | Lopatin |
| 6,534,116 B2 | 3/2003 | Basol |
| 6,676,822 B1 | 1/2004 | Talieh |
| 6,709,565 B2 | 3/2004 | Mayer et al. |
| 6,858,121 B2 | 2/2005 | Basol |
| 6,867,136 B2 | 3/2005 | Basol et al. |
| 6,902,659 B2 | 6/2005 | Talieh |
| 7,189,647 B2 | 3/2007 | Patton et al. |
| 2002/0166773 A1 | 11/2002 | Cohen |
| 2007/0105377 A1 | 5/2007 | Koos et al. |

\* cited by examiner

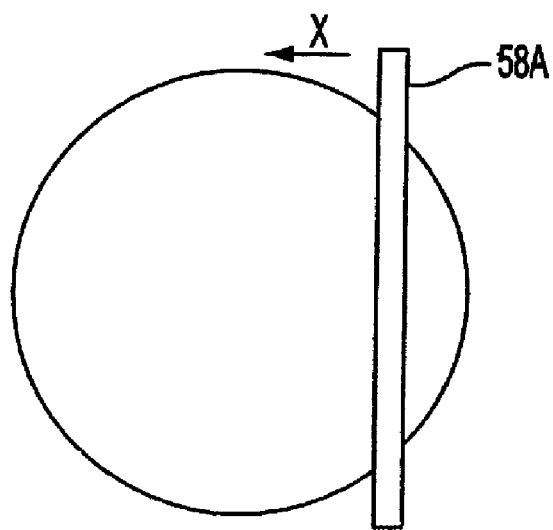
FIG. 5d1
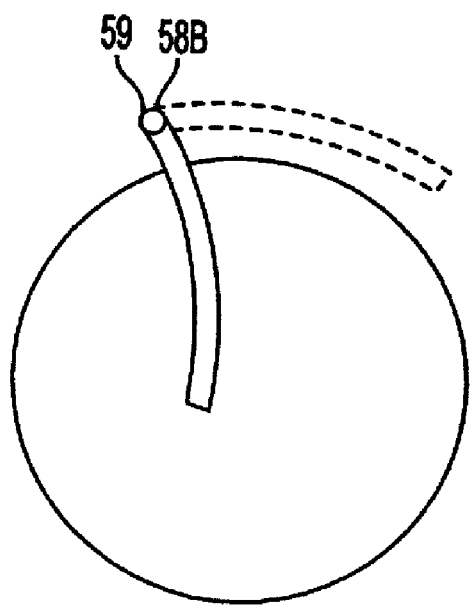
FIG. 5d2

PLATING METHOD AND APPARATUS FOR CONTROLLING DEPOSITION ON PREDETERMINED PORTIONS OF A WORKPIECE

CROSS-REFERENCE TO RELATED APPLICATIONS

This application is a divisional of U.S. patent application Ser. No. 11/190,763, filed Jul. 26, 2005, which is a continuation of U.S. patent application Ser. No. 09/961,193, filed Sep. 20, 2001, now U.S. Pat. No. 6,921,551, which is a continuation-in-part of U.S. patent application Ser. No. 09/919,788, filed Jul. 31, 2001, now U.S. Pat. No. 6,858,121, which is a continuation-in-part of U.S. patent application Ser. No. 09/740,701, filed Dec. 18, 2000, now U.S. Pat. No. 6,534,116, which claims priority benefit of U.S. Provisional Patent Application Ser. No. 60/224,739, filed Aug. 10, 2000.

FIELD OF THE INVENTION

The present invention relates generally to an electroplating method and apparatus. More particularly, the present invention is directed to a method and apparatus that creates a differential between additives adsorbed on different portions of a workpiece using an external influence and thus either enhance or retard plating of a conductive material on these portions

BACKGROUND OF THE INVENTION

There are many steps required in manufacturing multi-level interconnects for integrated circuits (IC). Such steps include depositing conducting and insulating materials on a semiconductor wafer or workpiece followed by full or partial removal of these materials using photo-resist patterning, etching, and the like. After photolithography, patterning and etching steps, the resulting surface is generally non-planar as it contains many cavities or features such as vias, contact holes, lines, trenches, channels, bond-pads, and the like that come in a wide variety of dimensions and shapes. These features are typically filled with a highly conductive material before additional processing steps such as etching and/or chemical mechanical polishing (CMP) is/are performed. Accordingly, a low resistance interconnection structure is formed between the various sections of the IC after completing these deposition and removal steps multiple times.

Copper (Cu) and Cu alloys are quickly becoming the preferred materials for interconnections in ICs because of their low electrical resistivity and high resistance to electro-migration. Electrodeposition is one of the most popular methods for depositing Cu into the features on the workpiece surface. Therefore the present invention will be described for electroplating Cu although it is in general applicable for electroplating any other material. During a Cu electrodeposition process, specially formulated plating solutions or electrolytes are used. These solutions or electrolytes contain ionic species of Cu and additives to control the texture, morphology, and the plating behavior of the deposited material. Additives are needed to obtain smooth and well-behaved layers. There are many types of Cu plating solution formulations, some of which are commercially available. One such formulation includes Cu-sulfate ($CuSO_4$) as the copper source (see for example James Kelly et al., Journal of The Electrochemical Society, Vol. 146, pages 2540-2545, (1999)) and includes water, sulfuric acid ($H_2SO_4$), and a small amount of chloride ions. As is well known, other chemicals, called additives, are generally added to the Cu plating solution to achieve desired properties of the deposited material. These additives get attached to or chemically or physically adsorbed on the surface of the substrate to be coated with Cu and therefore influence the plating there as we will describe below.

The additives in the Cu plating solution can be classified under several categories such as accelerators, suppressors/inhibitors, levelers, brighteners, grain refiners, wetting agents, stress-reducing agents, etc. In many instances, different classifications are often used to describe similar functions of these additives. Today, solutions used in electronic applications, particularly in manufacturing ICs, contain simpler two-component additive packages (e.g., see Robert Mikkola and Linlin Chen, "Investigation of the Roles of the Additive Components for Second Generation Copper Electroplating Chemistries used for Advanced Interconnect Metallization," Proceedings of the International Interconnect Technology Conference, pages 117-119, Jun. 5-7, 2000). These formulations are generically known as suppressors and accelerators. Some recently introduced packages for example Via-Form chemistry marketed by Enthone, Inc. of West Haven, Conn. and Nano-Plate chemistry marketed by Shipley, now Rohm and Haas Electronic Materials of Marlborough, Mass., also include a third component called a leveler.

Suppressors or inhibitors are typically polymers and are believed to attach themselves to the workpiece surface at high current density regions, thereby forming, in effect, a high resistance film, increasing polarization there and suppressing the current density and therefore the amount of material deposited thereon. Accelerators, on the other hand, enhance Cu deposition on portions of the workpiece surface where they are adsorbed, in effect reducing or eliminating the inhibiting function of the suppressor. Levelers are added in the formulation to avoid formation of bumps or overfill over dense and narrow features as will be described in more detail hereinafter. Chloride ions themselves affect suppression and acceleration of deposition on various parts of the workpiece (See Robert Mikkola and Linlin Chen, "Investigation" Proceedings article referenced above). The interplay between all these additives in-part determines the nature of the Cu deposit.

The following figures are used to more fully describe a conventional electrodeposition method and apparatus. FIG. 1 illustrates a cross-sectional view of an example workpiece 3 having an insulator 2 formed thereon. Using conventional deposition and etching techniques, features such as a dense array of small vias 4a, 4b, 4c and a dual damascene structure 4d are formed on the insulator 2 and the workpiece 3. In this example, the vias 4a, 4b, 4c are narrow and deep; in other words, they have high aspect ratios (i.e., their depth to width ratio is large). Typically, the widths of the vias 4a, 4b, 4c may be sub-micron. The dual-damascene structure 4d, on the other hand, has a wide trench 4e and a small via 4f on the bottom. The wide trench 4e has a small aspect ratio. In certain embodiments, the trench 4e has an aspect ratio between about 1:5 and 1:50.

FIGS. 2a-2c illustrate a conventional method for filling the features of FIG. 1 with Cu. FIG. 2a illustrates the exemplary workpiece of FIG. 1 having various layers disposed thereon. For example, this figure illustrates the workpiece 3 and the insulator 2 having deposited thereon a barrier/glue or adhesion layer 5 and a seed layer 6. The barrier/glue layer 5 may be tantalum, nitrides of tantalum, titanium, tungsten, or TiW, etc., or combinations of any other materials that are commonly used in this field. The barrier/glue layer 5 is generally deposited using any of the various sputtering methods, by chemical vapor deposition (CVD), etc. Thereafter, the seed layer 6 is deposited over the barrier/glue layer 5. The seed layer 6 material may be copper or copper substitutes and may be deposited on the barrier/glue layer 5 using various methods known in the field.

In FIG. 2b, after depositing the seed layer 6, a conductive material 7 (e.g., copper layer) is electrodeposited thereon from a suitable plating bath. During this step, an electrical contact is made to the Cu seed layer and/or the barrier layer so that a cathodic (negative) voltage can be applied thereto with respect to an anode (not shown). Thereafter, the Cu material 7 is electrodeposited over the workpiece surface using the specially formulated plating solutions, as discussed above. It should be noted that the seed layer is shown as an integral part of the deposited copper layer 7 in FIG. 2b. By adjusting the amounts of the additives, such as the chloride ions, suppressor/inhibitor, and the accelerator, it is possible to obtain bottom-up Cu film growth in the small features.

As shown in FIG. 2b, the Cu material 7 completely fills the vias 4a, 4b, 4c, 4f and is generally conformal in the large trench 4e. Copper does not completely fill the trench 4e because the additives that are used in the bath formulation are not operative in large features. For example, it is believed that the bottom up deposition into the vias and other features with large aspect ratios occurs because the suppressor/inhibitor molecules attach themselves to the top portion of each feature opening to suppress the material growth thereabouts. These molecules cannot effectively diffuse to the bottom surface of the high aspect ratio features such as the vias of FIG. 1 through the narrow openings. Preferential adsorption of the accelerator on the bottom surface of the vias, therefore, results in faster growth in that region, resulting in bottom-up growth and the Cu deposit profile as shown in FIG. 2b. Without the appropriate additives, Cu can grow on the vertical walls as well as the bottom surface of the high aspect ratio features at the same rate, thereby causing defects such as seams and voids, as is well known in the industry.

Adsorption characteristics of the suppressor and accelerator additives on the inside surfaces of the low aspect-ratio trench 4e is not expected to be any different than the adsorption characteristics on the top surface or the field region 8 of the workpiece. Therefore, the Cu thickness at the bottom surface of the trench 4e is about the same as the Cu thickness over the field regions 8. Field region is defined as the top surface of the insulator in between the features etched into it.

As can be expected, to completely fill the trench 4e with the Cu material 7, further plating is required. FIG. 2c illustrates the resulting structure after additional Cu plating. In this case, the Cu thickness t3 over the field region 8 is relatively large and there is a step s1 from the field regions 8 to the top of the Cu material 7 in the trench 4b. Furthermore, if there is no leveler included in the electrolyte formulation, the region over the high aspect-ratio vias can have a thickness t4 that is larger than the thickness t3 near the large feature. This phenomena is called "overfill" and is believed to be due to enhanced deposition over the high aspect ratio features resulting from the high accelerator concentration in these regions. Apparently, accelerator species that are preferentially adsorbed in the small vias as explained before, stay partially adsorbed even after the features are filled. For IC applications, the Cu material 7 needs to be subjected to CMP or other material removal process so that the Cu material 7 as well as the barrier layer 5 in the field regions 8 are removed, thereby leaving the Cu material 7 only within the features as shown in 2d. The situation shown in FIG. 2d is an ideal result. In reality these material removal processes are known to be quite costly and problematic. A non-planar surface with thick Cu such as the one depicted in FIG. 2c has many drawbacks. First of all, removal of a thick Cu layer is time consuming and costly. Secondly, the non-uniform surface cannot be removed uniformly and results in dishing defects in large features as well known in the industry and as shown in FIG. 2e.

Thus far, much attention has been focused on the development of Cu plating chemistries and plating techniques that yield bottom-up filling of small features on a workpiece. This is necessary because, as mentioned above, lack of bottom-up filling can cause defects in the small features. Recently, levelers have been added into the electrolyte formulations to avoid overfilling over high aspect ratio features. As bumps or overfill start to form over such features, leveler molecules are believed to attach themselves over these high current density regions (i.e., bumps or overfill, and reduce plating there, effectively leveling the film surface). Therefore, special bath formulations and pulse plating processes have been developed to obtain bottom-up filling of the small features and reduction or elimination of the overfilling phenomenon.

A new class of plating techniques called Electrochemical Mechanical Deposition (ECMD) have been developed to deposit planar films over workpieces with cavities of all shapes, sizes and forms. Methods and apparatus to achieve thin and planar Cu deposits on electronic workpieces such as semiconductor wafers are invaluable in terms of process efficiency. Such a planar Cu deposit is depicted in FIG. 3. The Cu thickness t5 over the field regions 8 in this example is smaller than the traditional case as shown in FIG. 2c. Removal of the thinner Cu layer in FIG. 3 by CMP, etching, electropolishing or other methods would be easier, providing important cost savings. Dishing defects are also expected to be minimal in removing planar layers such as the one shown in FIG. 3.

Recently issued U.S. Pat. No. 6,176,992, entitled "Method and Apparatus for Electro-Chemical Mechanical Deposition," commonly owned by the assignee of the present invention, discloses in one aspect a technique that achieves deposition of the conductive material into the cavities on the workpiece surface while minimizing deposition on the field regions. This ECMD process results in planar material deposition.

U.S. patent application Ser. No. 09/740,701 filed on Dec. 18, 2000 entitled "Plating Method and Apparatus that Creates a Differential Between Additive Disposed On a Top Surface and a Cavity Surface of a Workpiece Using an External Influence," now U.S. Pat. No. 6,534,116, and assigned to the same assignee as the present invention, describes in one aspect an ECMD method and apparatus that causes a differential in additives to exist for a period of time between a top surface and a cavity surface of a workpiece. While the differential is maintained, power is applied between an anode and the workpiece to cause greater relative plating of the cavity surface than the top surface.

Other applications filed that relate to specific improvements in various aspects of ECMD processes include U.S. patent application Ser. No. 09/511,278, entitled "Pad Designs and Structures for a Versatile Materials Processing Apparatus," filed Feb. 23, 2000, now U.S. Pat. No. 6,413,888; U.S. patent application Ser. No. 09/621,969, entitled "Method and Apparatus Employing Pad Designs and Structures with Improved Fluid Distribution," filed Jul. 21, 2000, now U.S. Pat. No. 6,413,403; U.S. patent application Ser. No. 09/960, 236, entitled "Mask Plate Design," filed Sep. 20, 2001, now U.S. Pat. No. 7,201,829, which claims a benefit to provisional application No. 60/272,791, filed Mar. 1, 2001; U.S. patent application Ser. No. 09/671,800, entitled "Method to Minimize and/or Eliminate Conductive Material Coating Over the Top Surface of a Patterned Substrate and Layer Structure Made Thereby," filed Sep. 28, 2000, now abandoned; and U.S. patent application Ser. No. 09/760,757, entitled "Method and Apparatus for Electrodeposition of Uniform Film with Minimal Edge Exclusion on Substrate," now U.S. Pat. No. 6,610,190, all of which applications are assigned to the same assignee as the present invention.

While the above-described ECMD processes provide numerous advantages, further refinements that allow for greater control of material deposition in areas corresponding to various cavities, to yield new and novel conductor structures, are desirable.

SUMMARY OF THE INVENTION

It is an object of the present invention to provide apparatus and methods that plate a conductive material on a workpiece surface.

It is another object of the present invention to provide apparatus and methods that plate a conductive material in both small and large features of a workpiece surface with efficiency, cost-savings, and superior quality.

It is a further object of the present invention to provide apparatus and methods for using a workpiece surface influencing device to obtain a differential between additives disposed on a top surface of a conductive layer and additives within cavity surfaces of the conductive layer, while minimizing the surface area of the workpiece surface influencing device that contacts the top surface of the conductive layer.

It is a further object of the present invention to provide apparatus and methods for using a workpiece surface influencing device to obtain a differential between additives disposed on a top surface of a conductive layer and additives within cavity surfaces of the conductive layer, while minimizing the amount of time that the workpiece surface influencing device contacts a given area on the top surface of the conductive layer.

It is a further object of the present invention to provide for various methods of operating a workpiece surface influencing device along with a plating apparatus to achieve various desirable semiconductor structures.

It is a further object to provide a method of modifying a conventional plating apparatus to use a workpiece surface influencing device.

The above objects of the invention, among others, taken alone or in combination, are achieved by the present invention, which provides apparatus for, and methods of, plating a conductive material on the surface of a workpiece.

In one aspect of the invention, an electrolyte solution with at least one additive disposed therein is applied over the workpiece, such that the additive becomes adsorbed onto the top portion and the cavity portion of the workpiece. Using a workpiece surface influencing device, such as a mask or sweeper, that preferentially contacts the top surface of the workpiece, relative movement between the workpiece and the workpiece surface influencing device is established so that the additive adsorbed onto the top surface is removed or otherwise its amount or concentration changed with respect to the additive on the cavity surface of the workpiece. Plating of the conductive material can place prior to, during and after usage of the workpiece surface influencing device, particularly after the workpiece surface influencing device no longer contacts any portion of the top surface of the workpiece.

In another aspect of the method, the workpiece surface influencing device uses a sweeper that directly contacts the top surface of the workpiece and there is also preferably included a shaping plate located between the anode and the cathode to assist with providing uniform film deposition on the workpiece.

In a further aspect of the invention, a method is disclosed for modifying a conventional plating apparatus with a workpiece surface influencing device according to the present invention.

In another aspect of the invention, novel semiconductor structures are described.

BRIEF DESCRIPTION OF THE DRAWINGS

These and other objects, advantages and aspects of the present invention will become apparent and more readily appreciated from the following detailed description of the presently preferred exemplary embodiments of the invention taken in conjunction with the accompanying drawings, of which:

FIGS. 5a-5c, 5d1, and 5d2 illustrate various sweepers that can be used with the electrochemical mechanical deposition apparatus according to the present invention.

DETAILED DESCRIPTION OF THE PREFERRED EMBODIMENT

Figure 1:
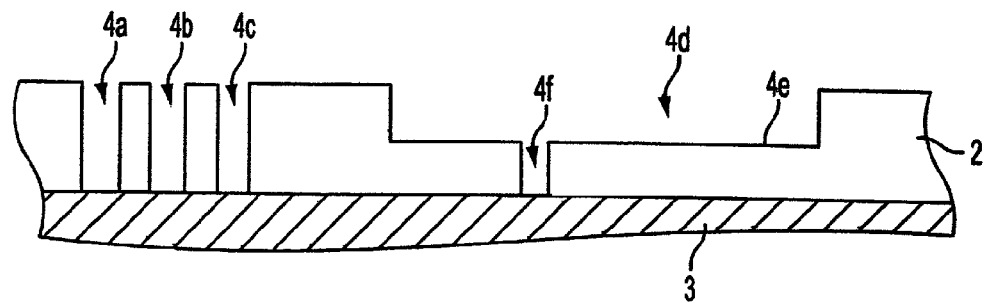
FIG. 1 illustrates a cross section of a portion of a workpiece structure with features therein that requires application of a conductive material thereover.

The preferred embodiments of the present invention will now be described with reference to the following figures. The inventors of the present invention have found that by plating the conductive material on the workpiece surface using the present invention, a more desirable and high quality conductive material can be deposited in the various features therein.

The present invention can be used with any workpiece such as a semiconductor wafer, flat panel, magnetic film head, packaging substrate, and the like. Further, specific processing parameters such as material, time and pressure, and the like are provided herein, which specific parameters are intended to be explanatory rather than limiting. For example, although copper is given as an example of the plated material, any other material can be electroplated using this invention provided that the plating solution has at least one of plating enhancing and inhibiting additives in it.

The plating method described herein is a type of ECMD technique where an external influence is used on the workpiece surface to influence additive adsorption there. The present invention describes a method and apparatus for plating the conductive material onto the workpiece by moving a workpiece-surface-influencing device, such as a mask or sweeper as described further herein and is positioned between the anode and the workpiece, to at least intermittently make contact with the various surface areas of the workpiece surface to establish an additive differential between the top surface and the workpiece cavity features. Once the additive differential is established, power that is applied between an anode and the workpiece will cause plating to occur on the workpiece surface, typically more predominantly within the cavity features than on the top surface. It should be noted that the workpiece-surface-influencing device may be applied to the top surface at any time before or during plating or the application of power, to establish an additive differential. The present invention may also include a shaping plate, as also described further herein. Furthermore, the present invention is directed to novel plating method and apparatus that provide enhanced electrodeposition of conductive materials into and over the various features on the workpiece surface while reducing plating over others.

Before further discussing the present invention, the distinctions that are intended to be made herein between a mask (which can also be termed a pad, but will herein be referred to as a mask), a sweeper and a shaping plate will first be described. In applicant's U.S. Pat. Nos. 6,176,992 and 6,534,116 referenced above there is described a mask that sweeps the top surface of a workpiece and also provides an opening or openings of some type through which the flow of electrolyte therethrough can be controlled. Applicant has recognized that while such a mask as described works very well, that a combination of two different components, a sweeper and a shaping plate (which can also be referred to as a diffuser), can alternatively be used, although it is noted that a shaping plate can also be used with a mask, though in such instance there is redundant functionality between the two. It has also been found that while having both a sweeper and a shaping plate is desirable, that the present invention can be practiced using only a sweeper. Accordingly, the workpiece-surface-influencing device referred to herein is used to include a mask, a pad, a sweeper, and other variants thereof that are usable to influence the top surface of the workpiece more than surfaces that are below the level of the top surface such as surfaces within cavity features. It should be understood that there are workpiece surface influencing devices other than a mask or a sweeper that could potentially be utilized. The present invention is not meant to be limited to the specific mask and sweeper devices described herein, but rather includes any mechanism that through the action of sweeping establishes a differential between the additive content on the swept and the unswept surfaces of the workpiece. This differential is such that it causes more material deposition onto the unswept regions (in terms of per unit area) than the swept regions. This means the plating current density is higher on unswept surfaces than on swept surfaces.

Figure 4:
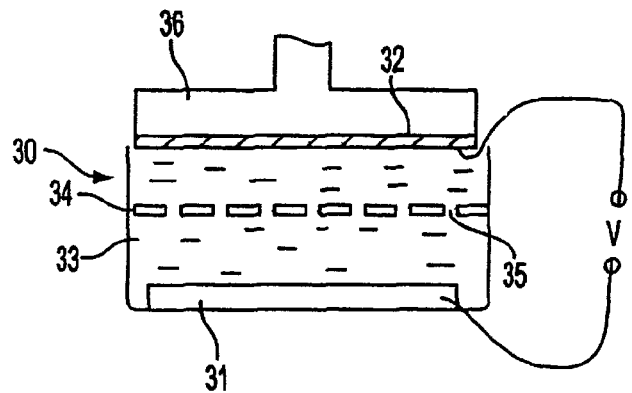
FIG. 4 illustrates a conventional plating apparatus.

FIG. 4 illustrates a conventional Cu plating cell 30 having therein an anode 31, a cathode 32, and an electrolyte 33. It should be noted that the plating cell 30 maybe any conventional cell and its exact geometry is not a limiting factor in this invention. For example the anode 31 may be placed in a different container in fluid communication with the plating cell 30. Both the anode 31 and the cathode 32 may be vertical, the anode 31 may be over the cathode 32, etc. There may also be a diffuser or shaping plate 34 in between the anode 31 and the cathode 32 to assist in providing a uniform film deposition on the workpiece. The shaping plate 34 will typically have asperities 35 that control fluid and electric field distribution over the cathode area to assist in attempting to deposit a globally uniform film.

Other conventional ancillary components can be used along with the present invention, but are not necessary to the practice of the invention. Such components include well known electroplating "thieves" and other means of providing for uniform deposition that may be included in the overall plating cell design. There may also be filters, bubble elimination means, anode bags, etc. used for purposes of obtaining defect free deposits.

The electrolyte 33 is in contact with the top surface of the cathode 32. The cathode 32 in the examples provided herein is a workpiece. For purposes of this description, the workpiece will be described as a wafer having various features on its top surface, and it is understood that any workpiece having such characteristics can be operated upon by the present invention. The wafer is held by a wafer holder 36. Any type of wafer holding approaches that allow application of power to the conductive surface of the wafer may be employed. For example, a clamp with electrical contacts holding the wafer at its front circumferential surface may be used. Another, and a more preferred method is holding the wafer by vacuum at its back surface exposing the full front surface for plating. One such approach is provided in U.S. patent application Ser. No. 09/960,236, entitled "Mask Plate Design," filed Sep. 20, 2001, which claims a benefit to provisional application No. 60/272,791, filed Mar. 1, 2001. When a DC or pulsed voltage, V, is applied between the wafer 32 and the anode 31, rendering the wafer mostly cathodic, Cu from the electrolyte 33 may be deposited on the wafer 32 in a globally uniform manner. In terms of local uniformity, however, the resulting copper film typically looks like the one depicted in FIG. 2c. In case there is leveling additive(s) in the electrolyte, the thickness t3 may be approximately equal to the thickness t4 since overfilling phenomenon would be mostly eliminated by the use of leveler. Power may be applied to the wafer 32 and the anode 31 in a current-controlled or voltage-controlled mode. In current-controlled mode, the power supply controls the current and lets the voltage vary to support the controlled amount of current through the electrical circuit. In voltage-controlled mode, the power supply controls the voltage, allowing the current to adjust itself according to the resistance in the electrical circuit.

Figure 5:
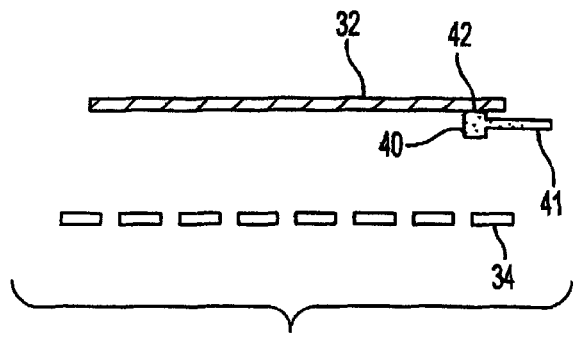
FIG. 5 illustrates an electrochemical mechanical deposition apparatus according to the present invention.

FIG. 5 illustrates a first preferred embodiment of the present invention, which can be made not only as a new device, but also by modifying the conventional plating apparatus such as described above in FIG. 4. In this embodiment of the present invention, a sweeper 40 is positioned in close proximity to the wafer 32. For simplicity, FIG. 5 only shows the shaping plate 34, the wafer 32 and the sweeper 40. During processing, sweeper 40 makes contact with the top surface of the wafer, sweeping it so that during at least part of the time copper deposition is performed, the additive differential exists. The sweeper 40 may be of any size and shape and may have a handle 41 that moves the sweeper 40 on the wafer surface, preferably using programmable control, and can also be retractable so that it moves the sweeper 40 entirely off of the area above the top surface of the wafer, which will result in even less interference than if the sweeper 40 is moved away from the wafer so that physical contact between the sweeper 40 and the wafer does not exist, as also described herein. The handle 41 preferably has a surface area that is small so as to minimize interference by the handle 41 with plating uniformity. The handle may also be coated with an insulating material on its outside surface, or made of a material, that will not interfere with the process chemistry or the electric fields used during plating.

It is preferable that the sweeper area 42 that makes contact with the wafer surface be small compared to the wafer surface so that it does not appreciably alter the global uniformity of Cu being deposited. There may also be small openings through the sweeper and the handle to reduce their effective areas that may interfere with plating uniformity. There may be means of flowing electrolyte through the handle and the sweeper against the wafer surface to be able to apply fluid pressure and push the sweeper away from the wafer surface when desired. As stated before, sweeper area needs to be small. For example, for a 200 mm diameter wafer with a surface area of approximately 300 cm$^2$, the surface area of the sweeper 40 may be less than 50 cm$^2$, and is preferably less than 20 cm$^2$. In other words in the first preferred embodiment of the present invention the sweeper 40 is used to produce an external influence on the wafer surface. The global uniformity of the deposited Cu is determined and controlled by other means such as the shaping plate 34 that are included in the overall design. The sweeping action may be achieved by moving the sweeper 40, the wafer or both in linear and/or orbital fashion.

Figure 5A:
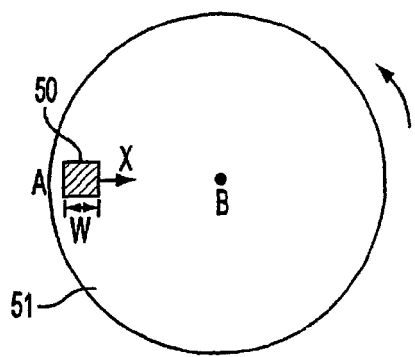

The sweeping motion of the sweeper may be a function of the shape of the sweeper. For example, FIG. 5a shows an exemplary sweeper 50 on an exemplary wafer 51. The moving mechanism or the handle of the sweeper is not shown in this figure, and can be implemented using conventional drive devices. In a particular embodiment, the wafer 51 is rotated around its origin B. As the wafer 51 is rotated, the sweeper 50 is scanned over the surface between the positions A and B in illustrated "x" direction. This way if the velocity of this scan is appropriately selected, every point on the wafer surface would be swept by the sweeper 50 intermittently. The velocity of the sweeper 50 may be kept constant, or it may be increased towards the center of the wafer 51 to make up for the lower linear velocity of the wafer surface with respect to the sweeper 50 as the origin B of the wafer rotation is approached. The motion of the sweeper can be continuous or the sweeper may be moved incrementally over the surface. For example, the sweeper 50 may be moved from location A to B at increments of W and it can be kept at each incremental position for at least one revolution of the rotating wafer to assure it sweeps every point on the wafer surface. There may be a device, such as an ultrasonic transducer, installed in the sweeper structure that increases the efficiency of the sweeping action and thus establishes more additive differential during a shorter time period. The wafer 51, in addition to rotation may also be translated during the sweeping process. While the relative movement preferably occurs at average speeds between the range of 1 to 100 cm/s, it is understood that the relative movement speed is one variable that can be used to control the resulting plating process, with other variables being noted herein. In a modification of this embodiment, the two positions A and B can be at opposite ends of the wafer, in which case the sweeper moves across the diameter of the wafer.

An alternate case involves a stationary wafer and a sweeper that is programmed to move over the wafer surface to sweep every point on that surface. Many different sweeper motions, both with and without motion of the wafer, may be utilized to achieve the desired sweeper action on the wafer surface.

Figure 5B:
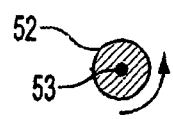

One particularly advantageous sweeper design shown in FIG. 5b is a rotational sweeper 52, which can move around axis 53. In this case, when the sweeper 52 is translated on the wafer surface, the wafer may or may not be moved because the relative motion between the wafer surface and the sweeper 52 which is necessary for sweeping the wafer surface is provided by the rotating sweeper. One attractive feature of this design is the fact that this relative motion would be constant everywhere on the wafer including at the center point B of the wafer. It should be noted that the rotational sweeper 52 may be designed in many different shapes although the preferred shape is circular as illustrated. It should also be noted that more than one circular sweeper may be operating on the substrate surface.

Figure 5C:
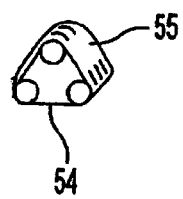

As shown in FIG. 5c, the sweeper may also be in the form of a small rotating sweeping belt 55 (rotating drive mechanism not shown, but being of conventional drive mechanisms) with a sweeping surface 54 resting against the wafer surface. Again, more than one such sweeper may be employed.

Each of the sweepers illustrated in FIGS. 5a-5c can be adapted to be placed on the end of a handle 41 as described above, such that the motion of the sweeper relative to the workpiece surface can be programmably controlled. Further, for embodiments such as those illustrated in FIGS. 5b and 5c where the sweeper itself is rotating about some axis, such as the center of the circular pad in FIG. 5b and around the small rollers in FIG. 5c, this rotation can also be separately and independently programmably controlled.

Another practical sweeper shape is a thin bar or wiper 58 shown in FIGS. 5d1 and 5d2 as being a straight bar 58A and a curved bar 58B, respectively. This bar 58 may be swept over the wafer surface in a given direction, such as the "x" direction shown in FIG. 5d1, under programmable control, and, if cylindrical, may also rotate around an axis. The bar 58 could also be stationery when being used, and, if desired, pivotable about a pivot point so that it could be removed from over the wafer surface when not in use, as shown in FIG. 5d2 with bar 58B and pivot 59. For each of the sweepers described above, the surface area of the sweeper portion of the sweeper that will physically contact the top surface of the wafer has a size that is substantially less than the top surface of the wafer. Typically, the surface area of the sweeper portion that contacts the top surface of the wafer is less than 20% of the surface area of the wafer, and preferably less than 10% of the surface area of the wafer. For the bar or wiper type sweeper, this percentage is even less.

The body of the sweepers as described above may be made of a composite of materials, as with the mask described above, with the outer surface made of any material that is stable in the plating solution, such as polycarbonate, TEFLON™, polypropylene and the like. It is, however, preferable, that at least a portion of the sweeping surface be made of a flexible insulating abrasive material that may be attached on a foam backing to provide uniform and complete physical contact between the workpiece surface and the sweeping surface. And while the sweeping surface may be flat or curved, formed in the shape of a circular pad, or a rotating belt, the surface of the sweeper that sweeps the top surface of the wafer should preferably be flat in macroscopic scale with microscopic roughness allowed to provide for efficient sweeping action. In other words the sweeper surface may have small size protrusions on it. However, if there are protrusions, they preferably should have flat surfaces, which may require conditioning of the sweeper, much like conventional CMP pads need to be conditioned. With such a flat surface, the top surface of the wafer is efficiently swept without sweeping inside the cavities.

If the sweeping surface is not flat, which may be the case when soft materials, such as polymeric foams of various hardness scales are used as sweeping surfaces, it is noted that the softer the material is, more likely it will sag into the cavities on the workpiece surface during sweeping. As a result, the additive differential established between the top surface and the cavity surfaces will not be as large and process efficiency is lost. Such a softer sweeper material can nevertheless be useful to fill deep features on a wafer or other type of workpiece in which any defects such as scratches on the workpiece surface layer is to be minimized or avoided. While the soft sweeper cannot efficiently fill the cavity once the cavity is filled to a level that corresponds to the sag of the soft material, preferential filling can exist until that point is reached. Beyond that point preferential filling of cavities may cease, and plating current may be distributed equally all over the surface of the wafer.

Referring again to FIG. 5, which could use any of the sweepers as described above, as the sweeper 40 moves over the surface of the wafer 32, it influences the additive concentrations adsorbed on the specific surface areas it touches. This creates a differential between the additive content on the top surface and within the cavities that are not physically swept by the sweeper. This differential, in turn, alters the amount of material deposited on the swept areas versus in the cavities.

Figure 2A:
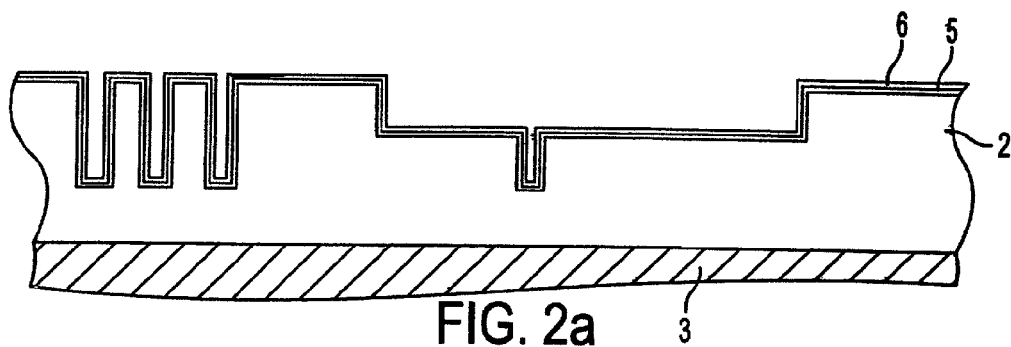
FIGS. 2a-2c illustrate, using various cross sectional views, a conventional method for filling the features of FIG. 1 with a conductor.
Figure 2B:
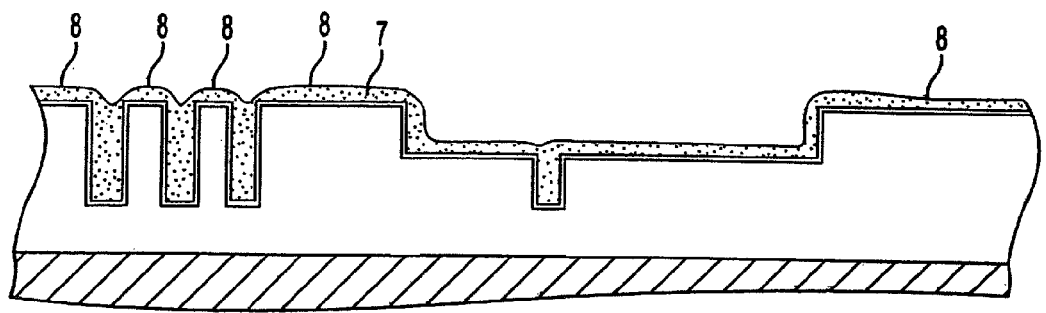
Figure 2C:
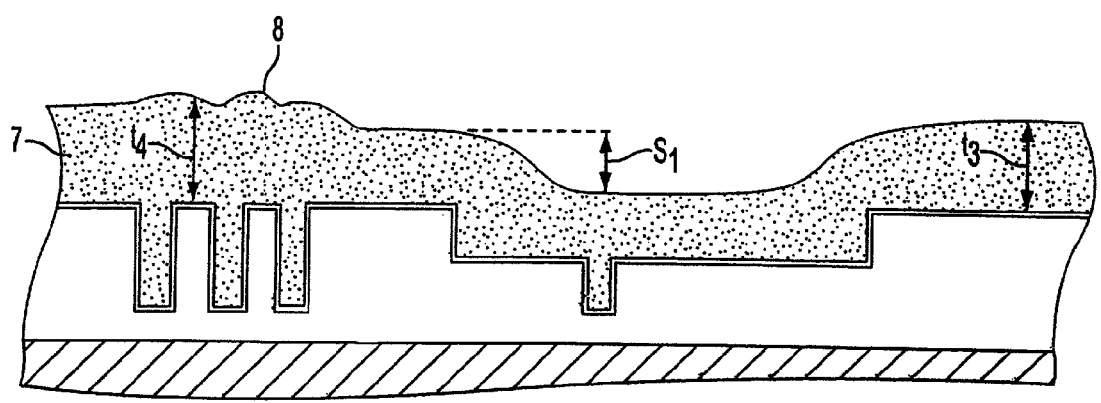
Figure 2D:
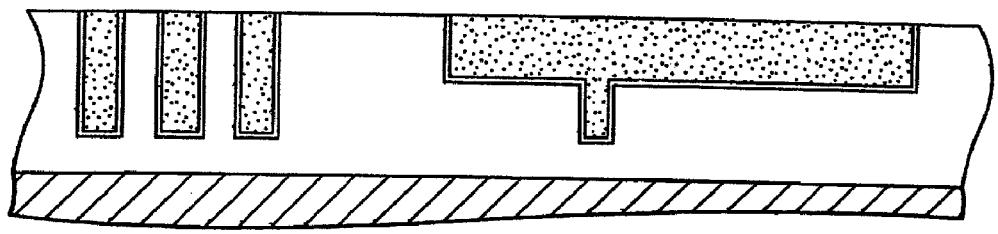
FIG. 2d illustrates a cross sectional view of an ideal workpiece structure containing the conductor within the features.

For example, consider a conventional Cu plating bath containing Cu sulfate, water, sulfuric acid, chloride ions and two types of additives (an accelerator and a suppressor). When used together, it is known that the suppressor inhibits plating on surfaces it is adsorbed and the accelerator reduces or eliminates this current or deposition inhibition action of the suppressor. Chloride is also reported to interact with these additives, affecting the performance of suppressing and accelerating species. When this electrolyte is used in a conventional plating cell such as the one depicted in FIG. 4, the resulting copper structure is as shown in FIG. 2c. If, however, the sweeper 40 starts to sweep the surface of the wafer after conventional plating is carried out initially to obtain the copper structure shown in FIG. 2b, the additive content on the surface regions is influenced by the sweeping action and various Cu film profiles, described hereinafter will result.

Figure 6A:
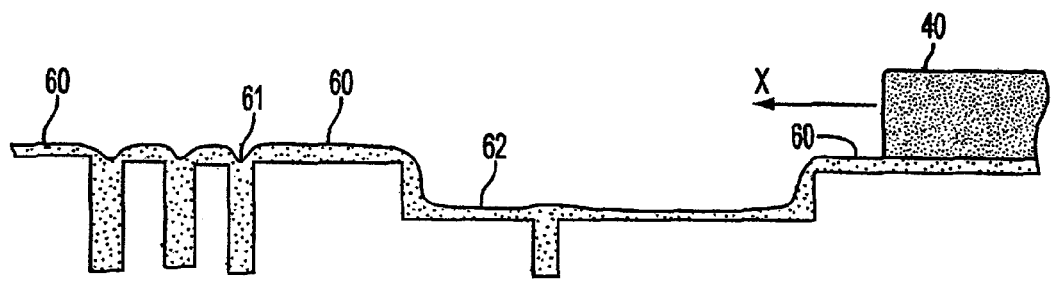
FIGS. 6a-6e, 6dd, and 6ee illustrate using various cross sectional views a method for obtaining desirable semiconductor structures according to the present invention.
Figure 6B:
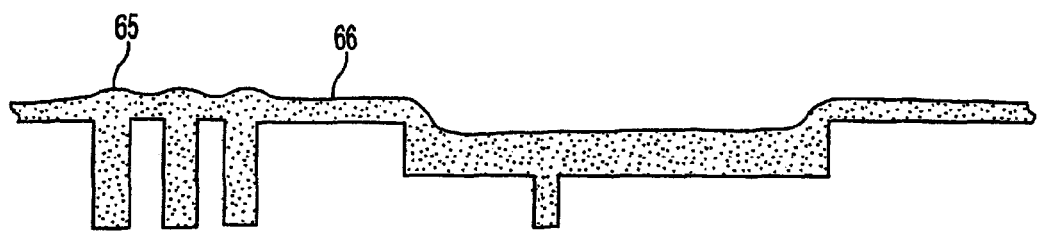

FIG. 6a (which is the same as FIG. 2b), shows the instant (called time zero herein) sweeper 40 sweeps the top surface areas 60 of the wafer that also has the provided exemplary cavity structure, by moving across its top surface in the direction x, preferably at a velocity of 2-50 mm/sec and an applied pressure, preferably in the range of 0.1-2 psi. Wafer may also be moving at the same time. It should be noted that the barrier/glue layer is not shown in some of the figures in this application for the purpose of simplifying the drawings. By mechanically sweeping the top surface regions 60, the sweeper 40 establishes a differential between the additives adsorbed on the top surfaces 60 and the exemplary small cavities 61 and large cavity 62. This differential is such that there is less current density inhibition in the cavities 61, 62 compared to the surface region 60, or in effect current density enhancement through the cavity surfaces. There may be many different ways the differential in additive content between the swept and unswept regions of the top surface may give rise to enhanced deposition current density through the unswept surfaces. For example, in the case of a electroplating bath comprising at least one accelerator and one suppressor, the sweeper 40 may physically remove at least part of the accelerator species from the surface areas therefore leaving behind more of the suppressor species. Or the sweeper may remove at least a portion of both accelerator and suppressor species from the top surface but the suppressor may adsorb back onto the swept surfaces faster that the accelerator right after the sweeper is removed from the surface. Another possibility is that activation of the top surfaces by the mechanical sweeping action may actually play a role in the faster adsorption of suppressor species, since it is known that freshly cleaned, in this case swept, material surfaces are more active than unclean surfaces in attracting adsorbing species. Another possible mechanism that may be employed in the practice of this invention is using an additive or a group of additives that when adsorbed on a surface, enhance deposition there, compared to a surface without adsorbed additives. In this case, the sweeper can be used to sweep away and thus reduce the total amount of additives on the swept surfaces and therefore reduce plating there compared to the unswept surfaces. It should also be noted that certain additives may act as accelerators or suppressor depending upon their chemical environment or other processing conditions such as the pH of the solution, the plating current density, other additives in the formulation etc. After the sweeper 40 sweeps the surface 60 at time zero, the sweeper 40 is moved away from the top surface of the wafer, and plating continues on the example cavity structure. However, because of the additive differential caused by the sweeper, more plating takes place into the cavity regions, with no further sweeping action occurring to result in the Cu deposit at a time t1 that is shown in FIG. 6b. Small bumps or overfill 65 may form over the vias due to the overfilling phenomena discussed earlier. If a leveler is also included in the chemistry these bumps can be avoided, however, as shown hereinafter, the present invention can eliminate these bumps without the need of a leveler.

The sweeper 40 is preferably moved away from the surface 60 by mechanical action, although increasing a pressure of the electrolyte on the sweeper 40, or through a combination thereof can also be used. Increased electrolyte pressure between the sweeper surface and the wafer surface may be achieved by pumping electrolyte through the sweeper against the wafer surface. Thus increased pressure then causes the sweeper to hydro-plane and loose physical contact with wafer surface.

Once a differential is established by the sweeper 40 in the additive content between the cavity and surface regions, this differential will start to decrease once the sweeping action is removed because additive species will start adsorbing again trying to reach their equilibrium conditions. The present invention is best practiced using additives that allow keeping this differential as long as possible so that plating can continue preferentially into the cavity areas with minimal mechanical touching by the sweeper on the wafer surface. The additive packages containing accelerator and suppressor species and supplied by companies such as Shipley and Enthone allow a differential to exist as long as a few seconds. For example, using a mixture of Enthone ViaForm copper sulfate electrolyte containing about 50 ppm of Cl, 0.5-2 ml/l of VFA Accelerator additive, and 5-15 ml/l of VFS Suppressor additive allows such a differential to exist. Other components can also be added for other purposes, such as small quantities of oxidizing species and levelers. Obviously, the differential becomes smaller and smaller as time passes before the sweeper 40 once again restores the large differential.

Figure 6C:
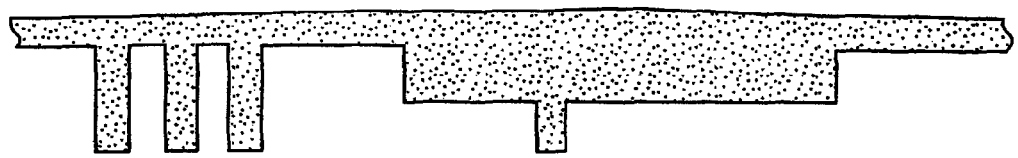

Let us assume that at time t1 the differential is a fraction of the amount it was when the sweeper 40 just swept the surface area. Therefore it may be time again to bring the sweeper 40 back and establish the additive differential. If the sweeper 40 is swept over the surface of the copper layer shown in FIG. 6b, in addition to the new top areas 66, the tops of the bumps 65 which are rich in deposition enhancing species will be swept. This action will reduce these species on the top of the bumps, in effect achieving what the leveler additives achieve in conventional plating processes. Continuing sweeping the surface in intervals one can obtain the flat Cu deposition profile shown in FIG. 6c. With respect to the FIG. 6c profile, it is also noted that this leveling occurs because the bumps or overfills, and the trough regions therebetween, provide a similar structure as the top surface portion and cavity portion that requires plating according to the present invention. Accordingly, by creating the additive differential between the overfills and the trough regions, plating of the trough regions occurs faster than plating of the overfills, and leveling occurs.

And with a sweeper 40 as described above, since plating on a large portion of the wafer can occur while another small portion of the wafer is being swept, this profile can be achieved with continuous sweeping without removing the sweeper 40 from the top surface of the wafer.

Let us now assume that at time t1 the additive differential between the top regions and within feature is still substantial so that conventional plating can continue over the copper structure of FIG. 6*b* without bringing back the sweeper 40. Since the enhanced current density still exists over the small features and within the large feature, by continuing conventional plating over the structure of FIG. 6*b*, one can obtain the unique structure of FIG. 6*d*, which has excess copper over the small and large features and a thin copper layer over the field areas. Such a structure may be attractive because when such a film is annealed, it will yield large grain size in the features over which there is thick copper, which results in lower resistivity interconnections and better electromigration resistance. This selective enhanced deposition is a unique feature of the present invention. Features with enhanced Cu layer are also attractive for the copper removal step (electroetching, etching or CMP steps), because the unwanted Cu on the field regions can be removed before removing all of the excess Cu over the features. Then excess Cu over the features can be removed efficiently and the planarization can be achieved without causing dishing and erosion defects. In fact, the excess Cu directly over the features may be removed efficiently by only the barrier removal step, as explained further hereinafter.

Figure 6D:
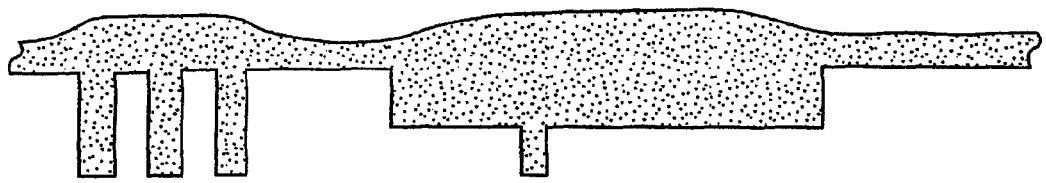
Figure 6E:
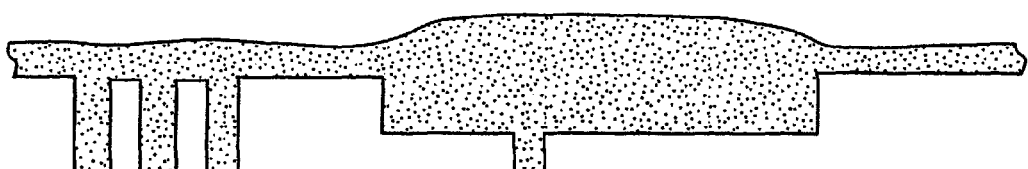
Figure 6D:
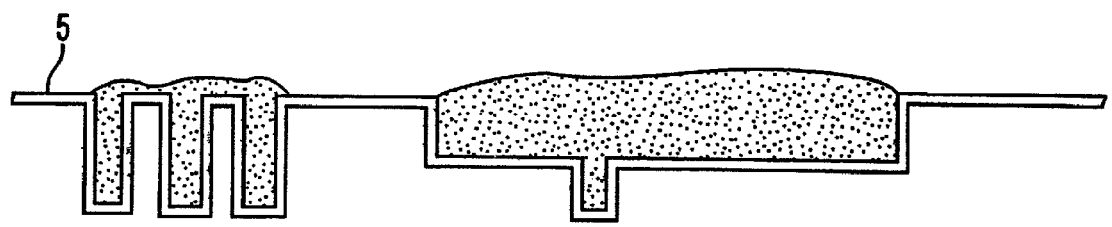
Figure 6E:
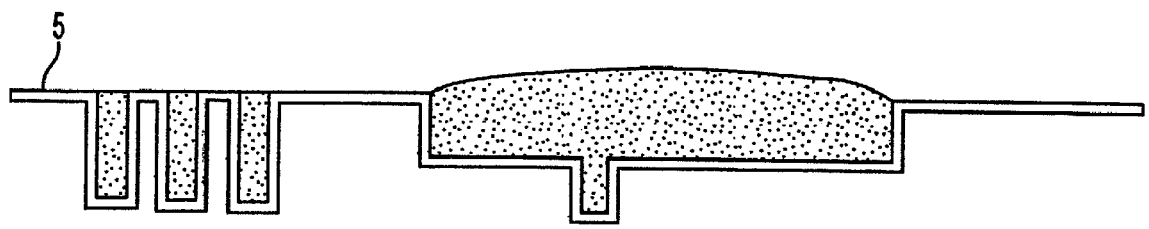

The structure in FIG. 6*e* can also be obtained by the present invention. In this case the sweeper 40 is swept over the structure of FIG. 6*b*. As explained previously, the tips of the bumps 65 in FIG. 6*b* are rich in current density enhancing or accelerating additive species. In fact this is the reason why the bumps or overfill regions form. By sweeping the tips of the bumps, the deposition enhancing species near the tips of the bumps are reduced and the growth of the bumps is slowed down. In other words the leveling action achieved chemically in the prior art by use of a leveler in the electrolyte formulation is achieved through the use of the mechanical sweeping of the present invention. After sweeping the surface and the bumps, plating is then continued with further sweeping occurring only to the extent necessary on the surface of the wafer, depending upon the characteristics of the bumps that are desired. This yields a near-flat Cu deposit over the small features and a bump or overfill over the large feature, as shown. It is apparent that the more sweeping action that occurs, the less pronounced the bumps will become.

It should be noted that the time periods during which the sweeper is used on the surface is a strong function of the additive kinetics, the sweeping efficiency, the plating current and the nature of the Cu layer desired. For example, if the plating current is increased, the preferential deposition into areas with additive differential may also be increased. The result then would be thicker copper layers over the features in FIGS. 6*d* and 6*e*. Similarly using additives with kinetic properties that allow the additive differential to last longer can give more deposition of copper over the unswept features because longer deposition can be carried out after sweeping and before bringing back the sweeper. The sweeping efficiency is typically a function of the relative velocity between the sweeper surface and the workpiece surface, the pressure at which sweeping is done, and the nature of the sweeper surface among other process related factors.

FIG. 6*dd* schematically shows the profile of the deposit in FIG. 6*d* after an etching, electroetching, CMP or other material removal technique is used to remove most of the excess Cu from the surface. For clarity, the barrier layer 5 is also shown in this figure. As can be seen in FIG. 6*dd*, excess Cu from most of the field region is removed leaving bumps of Cu only over the features.

FIG. 6*ee* similarly shows the situation after the wafer surface depicted in FIG. 6*e* is subjected to a material removal step. In this case there is a bump of Cu only over the large feature.

Figure 2E:
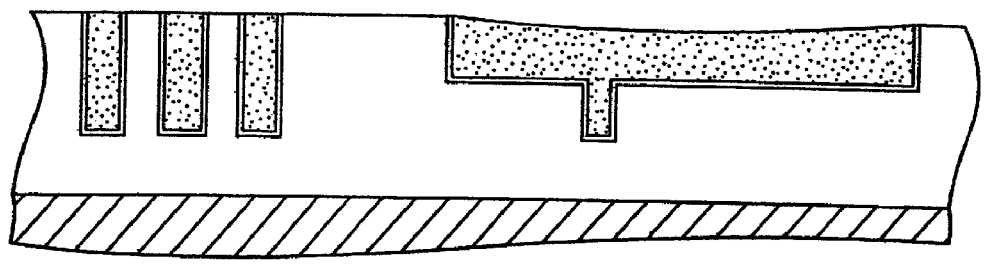
FIG. 2e illustrates a cross sectional view of a typical workpiece structure containing the conductor within the features.
Figure 3:
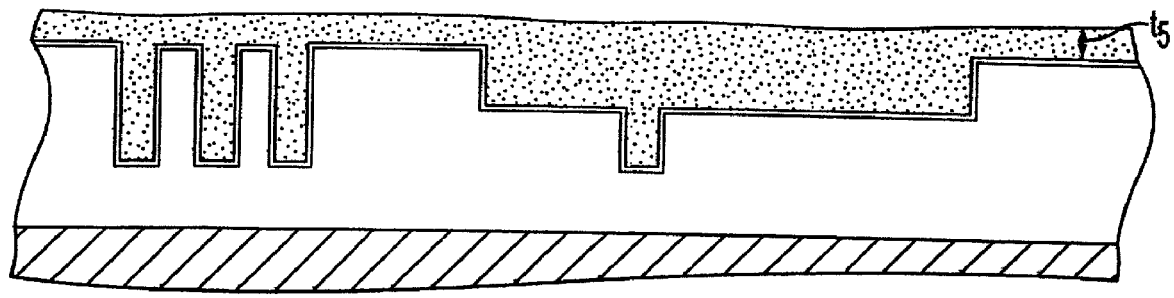
FIG. 3 illustrates a cross sectional view of a workpiece structure obtained using electrochemical mechanical deposition.

In any case removal of the bumps in FIGS. 6*dd* and 6*ee* and formation of a planar surface with no dishing can be achieved during the removal of the barrier layer 5 from the field regions using techniques such as CMP. The result is the structure shown in FIG. 2*d*. Dishing, which is depicted in FIG. 2*e*, is avoided in this process because there is excess Cu in the large feature at the beginning of the barrier removal step.

Figure 7:
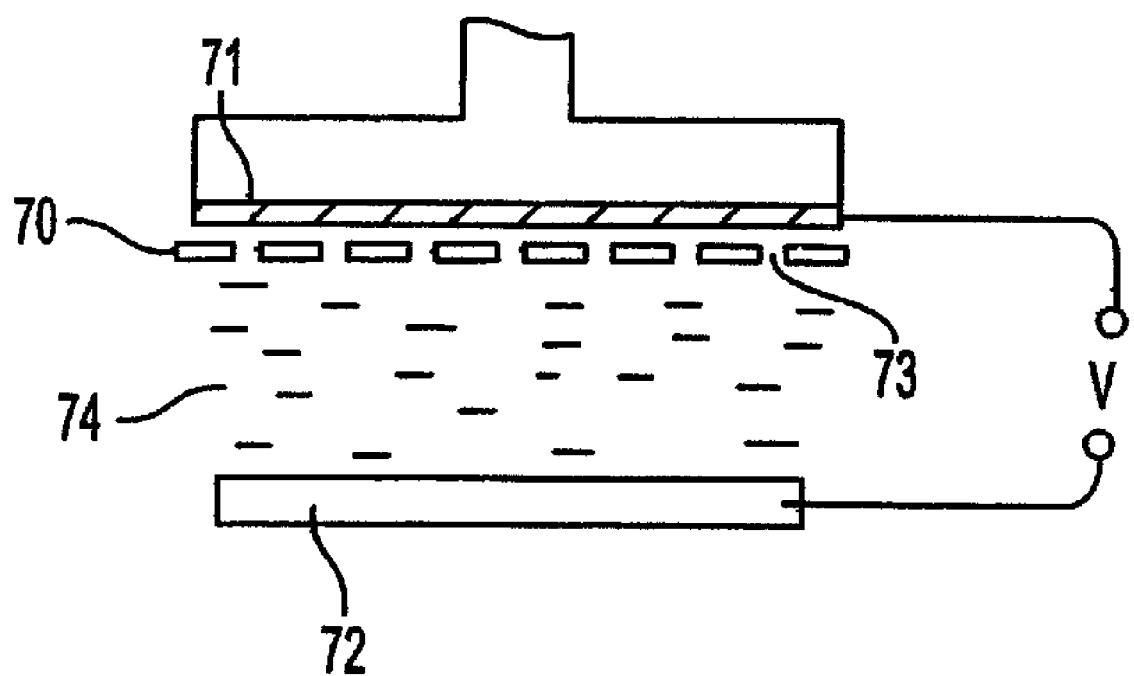
FIG. 7 illustrates a modified plating apparatus of the present invention.

It is possible to use DC, pulsed or AC power supplies for plating to occur using DC, pulsed, or AC power. Power can be controlled in many manners, including in a current controlled mode or in a voltage controlled mode or a combination thereof. Power can be cut off to the wafer during at least some period of the plating process. Especially if cutting off power helps establish a larger additive differential, power may be cut off during a short period when the sweeper sweeps the surface of the wafer and then power may be restored and enhanced deposition into the cavities ensues. Sweeper 40 may quickly sweep the surface at high pace and then retracted for a period of time or it may slowly move over the surface scanning a small portion at a time in a continuous manner. FIG. 7 is a sketch of an apparatus in accordance with the second preferred embodiment of the present invention, which can be made not only as a new device, but also by modifying the conventional plating apparatus such as described above in FIG. 4. In FIG. 7, a mask 70 is disposed in close proximity of the wafer 71. A means of applying voltage V between the wafer 71 and an electrode 72 is provided. The mask 70 has at least one, and typically many, openings 73 in it. The openings 73 are designed to assure uniform deposition of copper from the electrolyte 74 onto the wafer surface. In other words, in this embodiment the surface of the mask 70 facing the wafer surface is used as the sweeper and the mask 70 itself also establishes appropriate electrolyte flow and electric field flow to the wafer surface for globally uniform film deposition. Examples of specific mask that can be used are discussed in U.S. patent application Ser. No. 09/960,236, entitled "Mask Plate Design," filed Sep. 20, 2001, which claims a benefit to provisional application No. 60/272,791, filed Mar. 1, 2001.

During processing, the mask surface is brought into contact with the surface of the wafer as the wafer and/or the mask 70 are moved relative to each other. The surface of the mask 70 serves as the sweeper on the wafer surface and establishes the additive differential between the surface areas and the cavity surfaces.

For example the mask and wafer surfaces may be brought into contact, preferably at a pressure in the range of 0.1-2 psi, at time zero for a short period of time, typically for a period of 2 to 20 seconds or until an additive differential is created between the top surface and the cavity surface. After creating the differential between the additives disposed on the top surface portion of the wafer and the cavity surface portion of the wafer, as described above, the mask 70 is moved away from the wafer surface, preferably at least 0.1 cm, so that plating can occur thereafter. The mask is moved away from the wafer surface by mechanical action, increasing a pressure of the electrolyte on the mask, or through a combination thereof. As long as the differential in additives remains, plating can then occur. The plating period is directly related to the adsorption rates of the additives and the end copper structure desired. During this time, since the mask 70 does not contact the top surface of the wafer, the electrolyte solution then becomes disposed over the entire workpiece surface, thereby allowing plating to occur. And, due to the differential, plating will occur more onto unswept regions such as within features than on the swept surface of the wafer. Since the electrolyte is disposed over the entire wafer surface, this also assists in improving thickness uniformity of the plated layer and washing the surface of the workpiece off particulates that may have been generated during sweeping.

Also, this embodiment advantageously reduces the total time of physical contact between the mask 70 and the wafer and minimize possible defects such as scratches on the wafer. This embodiment may especially be useful for processing wafers with low-k dielectric layers. As well known in the industry, low-k dielectric materials are mechanically weak compared to the more traditional dielectric films such as SiO2. Once a sufficient additive differential no longer exists, the mask 70 can again move to contact the wafer surface and create the external influence, as described above. If the mask 70 repeatedly contacts the surface of the wafer, continued plating will yield the Cu film of FIG. 6*c*.

If a profile as illustrated in FIG. 6*d* is desired using this embodiment, then, in a manner similar to that mentioned above, after a profile as illustrated by FIG. 6*b* is achieved by plating based upon an additive differential as described above, then a conventional plating, without creating a further additive differential, can be used so that the profile illustrated in FIG. 6*d* is achieved.

If a profile as illustrated in FIG. 6*e* is desired using this embodiment, then, in a manner similar to that mentioned above, after a profile as illustrated by FIG. 6*b* is achieved by plating based upon an additive differential as described above, then a combination of plating based upon an additive differential as described above followed by conventional plating can be used so that the profile illustrated in FIG. 6*e* is achieved. This is obtained by using the mask to sweep the additive disposed on the bumps over the small features on the top surface of the wafer, and therefore slowing the growth of conductor down at those bumps. Accordingly, once the mask is moved away from the surface, growth continues more rapidly over the large features whose inside surfaces had not been swept by the mask action. While the FIG. 5 embodiment described above was described using a sweeper, and the FIG. 7 embodiment was described above using a mask, it is understood that the two mechanisms, both being workpiece-surface-influencing devices can be used interchangeably, with our without a shaping plate.

There are other possible interactive additive combinations that can be utilized and other additive species that may be included in the plating bath formulation. The present invention is not meant to be limited to the example interactive additive combinations cited herein, but rather includes any combination that establishes a differential between the additives on the swept and the unswept surfaces of the wafer. This differential is such that it causes more material deposition onto the unswept regions (in terms of per unit area) than the swept regions. This means the plating current density is higher on unswept surfaces than on swept surfaces. The sweeper 40 in FIG. 6*a* is preferably flat and large enough so that it does not go or sag into and sweep an inside surface of the largest features on the wafer.

Along with using copper and its alloys as the conductive material, many other conductive materials such as gold, iron, nickel, chromium, indium, lead, tin, lead-tin alloys, non-leaded solderable alloys, silver, zinc, cadmium, ruthenium, their respective alloys may be used in the present invention. The present invention is especially suited for the applications of high performance chip interconnects, packaging, magnetics, flat panels and opto-electronics.

In another embodiment, and of particular usefulness when using a mask or a sweeper for sweeping, it is recognized that the plating current can affect adsorption characteristics of additives. For some additives adsorption is stronger on surfaces through which an electrical current passes. In such cases, adsorbing species may be more easily removed from the surface they were attached to, after electrical current is cut off or reduced from that surface. Loosely bound additives can then be removed easily by the mask or the sweeper. In the cavities, although loosely bound, additives can stay more easily because they do not get influenced by the external influence. Once the mask or the sweeper is used to remove loosely bound additives with power cut off, the mask or the sweeper can be removed from the surface of the wafer, and power then applied to obtain plating, with the additive differential existing. This way sweeping time may be reduced minimizing physical contact between the sweeper and the wafer surface.

In the previous descriptions, numerous specific details are set forth, such as specific materials, mask designs, pressures, chemicals, processes, etc., to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiment are possible without materially departing from the novel teachings and advantages of this invention. It will be appreciated, therefore, that in some instances some features of the invention will be employed without a corresponding use of other features without departing from the spirit and scope of the invention as set forth in the appended claims.

What is claimed is:

1. A method of processing a workpiece comprising an upper surface, a field region defined by the upper surface, and a cavity having a depth below the upper surface and having a width, the width being greater than the depth, the method comprising:
   contacting the workpiece with an electrolyte solution;
   contacting an electrode with the electrolyte solution;
   forming a conductive material comprising a conductor on the workpiece, wherein forming the conductive material includes electroplating the conductor from the electrolyte solution, wherein forming the conductive material comprises:
      forming a first portion of the conductive material in the field region, the first portion having a first thickness above the upper surface of the workpiece; and
      forming a second portion of the conductive material in the cavity, the second portion filling the cavity and having a second thickness above the upper surface of the workpiece, wherein the second thickness is greater than the first thickness; and
   after forming the conductive material, completely removing the conductive material from the field region, wherein, after the removing, parts of the second portion of the conductive material remain above the upper surface of the cavity.

2. The method of claim 1, wherein the cavity comprises a damascene structure.

3. The method of claim 1, wherein the aspect ratio of the cavity is between about 1:5 and 1:50.

4. The method of claim 1, wherein the workpiece comprises a second cavity region comprising a second cavity having a depth below the upper surface and having a second width, the depth of the second cavity being greater than the second width of the second cavity, and wherein forming the conductive material further comprises forming a third portion of the conductive material in the second cavity region, the third portion filling the second cavity of the second cavity region and having a third thickness above the upper surface of the workpiece.

5. The method of claim 4, wherein, after removing the layer of the conductive material from the field region, the second thickness of the conductive material above the upper surface in the cavity region is at least as thick as the third thickness of the conductive material above the upper surface in the second cavity region.

6. The method of claim 4, wherein, after removing the layer of the conductive material from the field region, the second thickness of the conductive material above the upper surface in the cavity region is greater than the third thickness of the conductive material above the upper surface in the second cavity region.

7. The method of claim 4, wherein after removing the layer of the conductive material from the field region, parts of the second and third portions of the conductive material remain above the upper surface in the cavity region and the second cavity region, respectively.

8. The method of claim 7, wherein removing the layer comprises removing substantially all of the first thickness of the conductive material.

9. The method of claim 4, wherein, after removing the layer of conductive material from the field region, parts of the third portion of the conductive material remain above the upper surface in the second cavity region.

10. The method of claim 4, wherein, after removing the layer of conductive material from the field region, the conductive material above the upper surface in the second cavity region is substantially planar with the conductive material above the upper surface in the field region.

11. The method of claim 1, wherein removing the layer comprises removing substantially all of the first thickness of the conductive material.

12. The method of claim 1, wherein removing the layer of conductive material from the field region comprises chemical mechanical polishing.

13. The method of claim 12, wherein the upper surface of the workpiece comprises a barrier layer and wherein removing the layer of conductive material from the field region comprises removing the barrier layer in the field region.

14. The method of claim 1, wherein removing the layer of conductive material from the field region comprises electrochemical mechanical polishing.

15. The method of claim 1, wherein removing the layer of conductive material from the field region comprises etching.

16. The method of claim 1, further comprising providing differential additive concentrations between the first and second portions.

17. The method of claim 16, wherein providing the differential additive concentrations between the first and second portions is conducted after some forming of the conductive material and before filling the cavity.

18. The method of claim 16, wherein providing the differential additive concentrations comprises sweeping an additive from the first portion.

19. A method of processing a workpiece comprising an upper surface, a field region defined by the upper surface, and a cavity having a depth below the upper surface and having a width, the width being greater than the depth, the method comprising:

forming a conductive material over the upper surface, within the cavity, and overfilling the cavity to create a bump of the conductive material over the cavity, the bump protruding above the upper surface more than the conductive material protrudes above the upper surface in the field region, wherein forming the conductive material comprises:
electroplating the conductive material onto the workpiece from an electrolyte solution in contact with the workpiece and an electrode; and
sweeping a workpiece surface influencing device over the upper surface at a time when a top surface of the conductive material includes a depression over the cavity after forming the conductive material, completely removing the conductive material from the field region, wherein, after the removing, parts of the bump remain above the upper surface of the cavity.

20. The method of claim 19, wherein after sweeping a rate of plating within the cavity is higher than a rate of plating over the upper surface.

21. The method of claim 19, further comprising removing at least a portion of the conductive material over the upper surface in the field region outside the cavity.

22. The method of claim 21, wherein removing comprises removing substantially all of the conductive material over the upper surface in the field region.

23. The method of claim 21, wherein removing comprises removing part of the bump over the cavity.

24. The method of claim 21, wherein removing comprises chemical mechanical polishing.

25. The method of claim 24, wherein the upper surface of the workpiece comprises a barrier layer and wherein removing comprises removing the barrier layer in the field region.

26. The method of claim 21, wherein removing comprises electrochemical mechanical polishing.

27. The method of claim 21, wherein removing comprises etching.

28. The method of claim 19, further comprising annealing the conductive material, wherein annealed grain sizes of the conductive material in the cavity are larger than annealed grain sizes of the conductive material in the field region.

29. The method of claim 19, wherein sweeping comprises creating an additive differential between the conductive material within the cavity and the conductive material over the upper surface.

30. The method of claim 19, wherein sweeping the workpiece surface influencing device comprises removing an additive from parts of the conductive material.

31. The method of claim 30, wherein the electrolyte solution comprises the additive.

32. The method of claim 30, wherein the additive comprises an accelerator.

33. The method of claim 30, wherein sweeping the workpiece surface influencing device comprises contacting the electroplated conductive material over the upper surface.

34. The method of claim 19, wherein the workpiece comprises a second cavity having a depth below the upper surface and having a width, the depth of the second cavity being greater than the width of the second cavity, wherein forming the conductive material comprises forming the conductive material within the second cavity and overfilling the second cavity to create a second bump of the conductive material over the second cavity, and wherein the bump protrudes above the upper surface more than the second bump protrudes above the upper surface.

35. The method of claim 19, wherein the workpiece comprises a second cavity having a depth below the upper surface and having a width, the depth of the second cavity being greater than the width of the second cavity, wherein forming the conductive material comprises forming the conductive material within the second cavity and overfilling the second cavity to form a second bump of the conductive material over the second cavity, and wherein the height of the bump above the upper surface is at least a height of the second bump above the upper surface.

36. A method of processing a workpiece comprising an upper surface and a cavity, the cavity having a depth below the upper surface and having a width, the width being greater than the depth, the method comprising:

forming a first layer of a conductive material comprising a conductor over the upper surface and within the cavity, wherein forming the first layer includes electroplating the conductor from a first electrolyte solution in contact with the workpiece and an electrode;

after forming the first layer, contacting the first layer over the upper surface with a workpiece surface influencing device;

after contacting the first layer, forming a second layer of the conductive material over the first layer, wherein forming the second layer includes electroplating the conductor from a second electrolyte solution, wherein after forming the second layer, a thickness of the conductive material over the cavity and above the upper surface is greater than a thickness of the conductive material over the upper surface; and after forming the second layer, completely removing the conductive material over the upper surface, wherein, after the removing, parts of the conductive material remain over the cavity and above the upper surface.

37. The method of claim 36, wherein forming the second layer comprises not contacting the workpiece with the workpiece surface influencing device.

38. The method of claim 36, wherein the first electrolyte solution is different from the second electrolyte solution.

39. The method of claim 36, wherein after contacting the first layer over the upper surface, a rate of plating over the cavity is greater than a rate of plating over the upper surface.

40. The method of claim 36, wherein removing the portion comprises removing substantially all of the conductive material over the upper surface.

41. The method of claim 36, wherein removing comprises chemical mechanical polishing.

42. The method of claim 41, wherein the upper surface of the workpiece comprises a barrier layer and wherein removing the portion comprises removing a section of the barrier layer.

43. The method of claim 36, wherein removing comprises electrochemical mechanical polishing.

44. The method of claim 36, wherein removing comprises etching.

45. The method of claim 36, wherein the workpiece includes a plurality of second cavities each having a depth below the upper surface and having a width, the width of each said second cavity less than the depth of each said second cavity, wherein forming the first layer comprises forming the first layer within the second cavities by electroplating the conductor from the electrolyte solution.

46. The method of claim 45, wherein forming the first layer comprises filling the second cavities and wherein contacting the first layer comprises contacting the first layer over the second cavities and above the upper surface.

47. The method of claim 9, wherein removing the layer comprises removing substantially all of the first thickness of the conductive material.

48. The method of claim 36, wherein the first electrolyte solution is the same as the second electrolyte solution.

* * * * *